(12) United States Patent
Nishiura

(10) Patent No.: US 6,270,000 B1
(45) Date of Patent: Aug. 7, 2001

(54) WIRE BONDING METHOD

(75) Inventor: Shinichi Nishiura, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/517,263

(22) Filed: Mar. 2, 2000

(30) Foreign Application Priority Data

Mar. 2, 1999 (JP) .................................................. 11-053542

(51) Int. Cl.⁷ ........................... B23K 31/00; B23K 31/02
(52) U.S. Cl. ..................................... 228/180.5; 228/180.1
(58) Field of Search .............................. 228/180.5, 180.1

(56) References Cited

U.S. PATENT DOCUMENTS 5,295,619 * 3/1994 Takahashi et al. ................ 228/180.5
5,395,037 * 3/1995 Takahashi et al. ................ 228/180.5
5,981,371 * 11/1999 Yamazaki et al. .................... 438/617

FOREIGN PATENT DOCUMENTS

S57-87143 5/1982 (JP) .
H1-26531 5/1989 (JP) .

* cited by examiner

*Primary Examiner*—Tom Dunn
*Assistant Examiner*—Zidia Pittman
(74) *Attorney, Agent, or Firm*—Koda & Androlia

(57) ABSTRACT

In a wire bonding method for connecting first and second bonding points, after bonding a primary ball to a first bonding point and then the wire to the second bonding point, a secondary ball is formed by electrical charge on a tail end of a wire that extends out of the tip end of a capillary, this secondary ball is ball-bonded to an arbitrary point near the second bonding point, and then the wire is cut so as to leave a tail of wire out of the tip end of the capillary. A primary ball is formed at the end of the tail by electrical discharge and is bonded to a next first bonding point.

3 Claims, 2 Drawing Sheets

WIRE BONDING METHOD

BACKGROUND OF THE INVENTION

1. Field of the Invention

The present invention relates to a wire bonding method for connecting a first bonding point and a second bonding point with a wire.

2. Prior Art

Various wire bonding methods have been proposed in producing semiconductor devices. The most general method is illustrated in FIG. 2.

First, in step (a), a ball 2a is created by electrical discharge of an electric torch 3 on a wire 2 that extends from the lower end of a capillary 1. Afterward, the electric torch 3 is moved in the direction shown by the arrow. As shown in step (b), the capillary 1 is then moved to a point above the first bonding point 4a. In step (c), the capillary 1 is lowered, and the ball 2a at the tip end of the wire 2 is subjected to a first bonding to the first bonding point 4a.

Afterward, in step (d), the capillary 1 is raised. Then, in step (e), the capillary 1 is moved to a point above the second bonding point 5a, which is located on a lead 5. Next, in step (f), the capillary 1 is lowered, and the wire 2 is subjected to a second bonding to the second bonding point 5a. After the capillary 1 is raised to a predetermined position, a damper 6 is closed; and the capillary 1 and damper 6 are raised together so that the wire 2 is tail-cut from the attachment root of the second bonding point 5a in step (g).

One wire connection is thus completed.

Examples of this wire bonding method are disclosed in Japanese Patent Application Laid-Open (Kokai) No. S57-87143 and Japanese Patent Application Publication (Kokoku) No. H1-26531.

In Japanese Patent Application Laid-Open (Kokai) No. S57-87143, after finishing bonding to a first bonding point, a capillary is raised for a distance that is equal to the length required for bonding to a second bonding point, and then the capillary is moved along a circular path to the second bonding point or a point adjacent to the second boning point.

In Japanese Patent Application Publication (Kokoku) No. H1-26531, after the completion of bonding to a first bonding point, a capillary is moved in the opposite direction from the second bonding point, and then the capillary is moved along an oblique upward path and then oblique downward path so as to be brought to a second bonding point.

FIGS. 3(a) and 3(b) show the end of capillary in step (f) of FIG. 2 and the end of the wire in step (g) of FIG. 2.

As seen from step (f) and FIG. 3(a), the wire 2 is pressed against the second bonding point 5a on the lead 5; and in step (g), the wire 2 is tail-cut from the attachment root thereof. As a result, a projection 2c which is bent laterally remains at the tip end of the tail 2b (i.e., the portion of the wire 2 that extends out to the capillary 1) as shown in FIG. 3(b). As seen from FIG. 3(a), the projection 2c is formed when the wire 2 is pressed against the lead 5; and when the wire is thus pressed against the lead 5, impurities 7 on the surface of the lead 5 adhere to the undersurface of the projection 2c.

If the ball 2a is formed at the end of the wire with impurities 7 adhering thereto, the impurities 7 remain on the ball 2a, resulting in that the discharge efficiency changes, and abnormal balls are formed at the end of the wire. Furthermore, it is difficult to form a small ball. When the volume of the ball 2a formed is large enough to absorb the volume of the projection 2c, eccentricity would not occur in the ball 2a even if the projection 2c extends laterally at the end of the wire. However, when the ball 2a formed is small and is of the size close to the volume of the projection 2c, then the formed ball 2a is eccentric as shown in FIG. 3(c). In this regard as well, the formation of a small ball is difficult.

In recent years, so as to accomplish a reduction in the cost of dice (semiconductor elements), there has been a tendency to reduce the size of dice and to use a fine pitch bonding so that the spacing of pads is narrow and as small as approximately 50 to 60 microns. In conventional wire bonding methods, however, it is difficult to accomplish a formation of extremely small balls that are free of eccentricity as described above on the consistent basis. As a result, the conventional methods are not sufficiently able to comply with fine pitch bonding.

SUMMARY OF THE INVENTION

Accordingly, the object of the present invention is to provide a wire bonding method which accomplishes a consistent formation of balls at the end of a bonding wire that are subjected to first bonding to a first bonding point as an extremely small ball.

The above object is accomplished by unique steps of the present invention for a wire bonding method in which a first bonding is performed on a first bonding point by bonding a ball formed at the tail end of a wire, after which the wire is delivered from a capillary and a second bonding is performed on a second bonding point so that the first bonding point and second bonding point are connected by the wire; and in the present invention, after the bonding to the second bonding point is done and the bonded ball is separated from the wire, a secondary ball is formed at the tail end of the wire extending from the tip end of the capillary by performing a secondary discharge with an electric torch, this secondary ball is ball-bonded to an arbitrary point other than the second bonding point, then the bonded secondary ball is separated from the tail end of the wire extending from the tip end of the capillary, and a primary ball formed is on this tail end by performing a primary discharge with the electric torch, so that the thus formed ball is bonded to the next first bonding point.

In the present invention, the diameter of the secondary ball is set to be a large value, while the diameter of the primary ball is set to be a small value.

In other words, the diameter of the secondary ball is 1.7 times the diameter of the wire or greater, and the diameter of the primary ball is 1.5 times the diameter of the wire or less.

DETAILED DESCRIPTION OF THE PREFERRED EMBODIMENT

Figure 1:
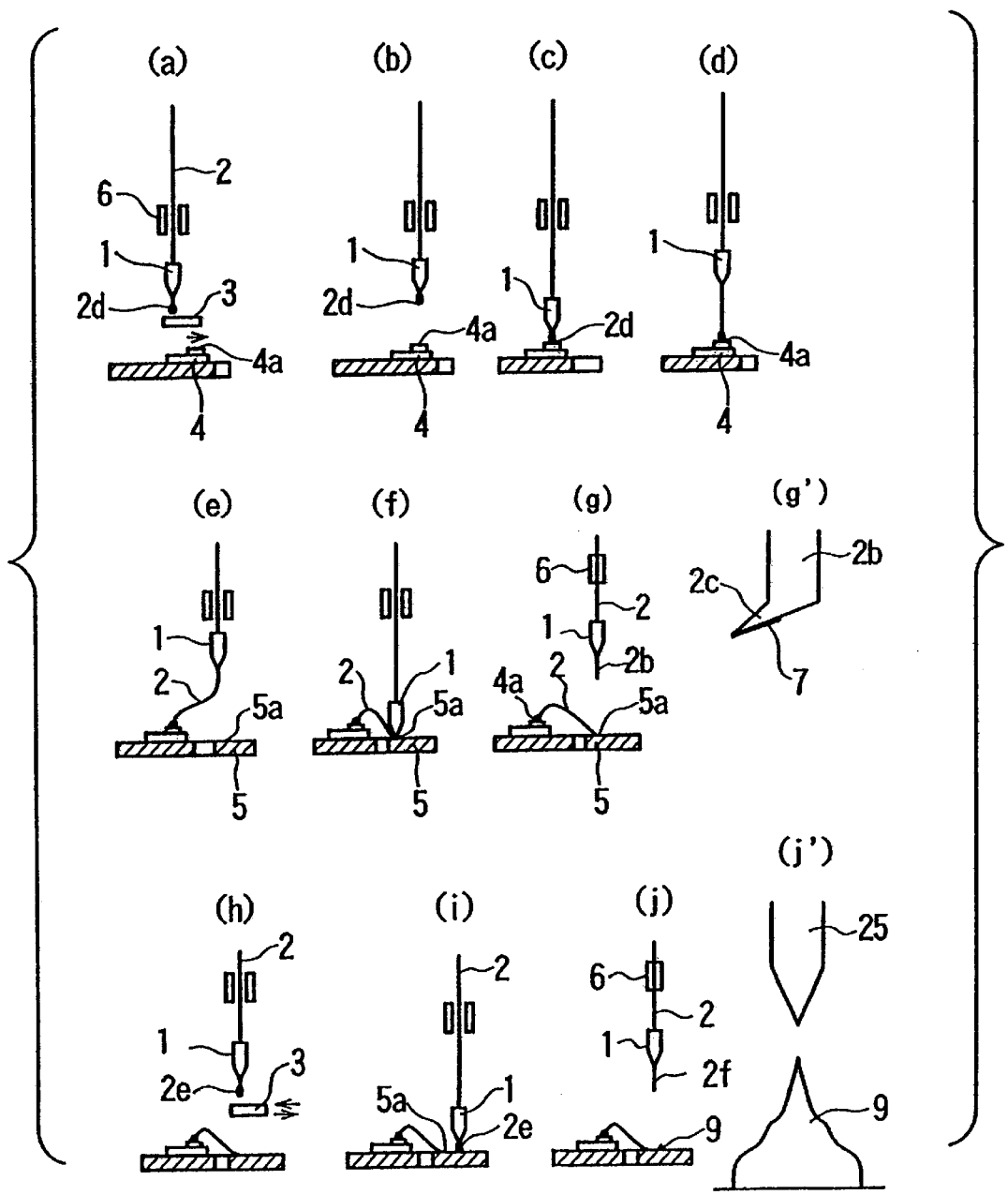
FIG. 1 shows steps (a) through (j') of the wire bonding method according to one embodiment of the present invention.
Figure 2:
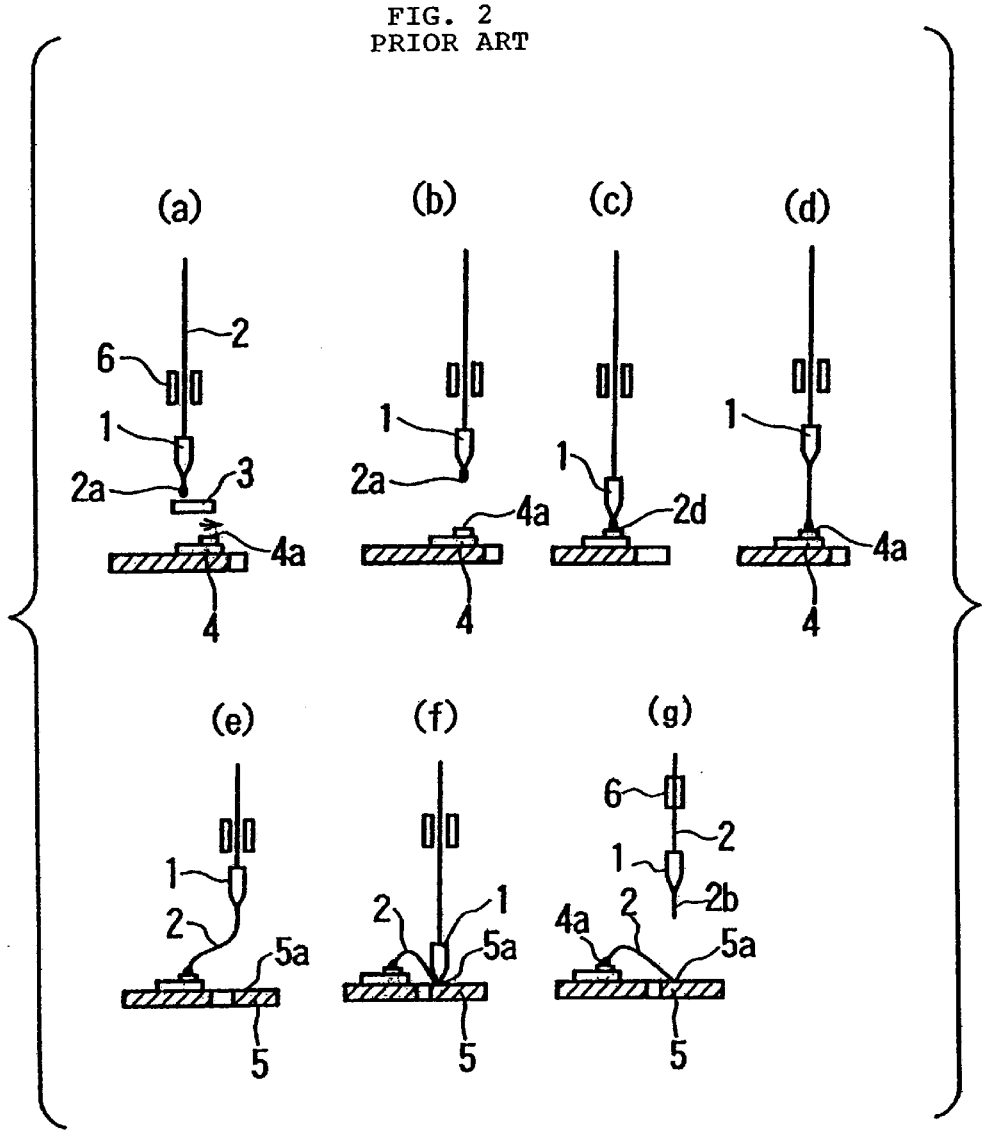
FIG. 2 shows steps (a) through (g) of the wire bonding method of the conventional wire bonding method.

One embodiment of the present invention will be described with reference to FIG. 1. The steps (a) through (g)

in FIG. 1 are the same as the steps (a) through (g) of FIG. 2 which are of an ordinary bonding operation. However, the ball 2d formed in step (a) of FIG. 1 differs from the ball 2a formed in step (a) of FIG. 2.

First, as shown in step (a), a primary ball (or first-bonding point ball) 2d is formed at the tail end of the wire 2 that extends from the lower end of the capillary 1 (i.e., the primary ball 2d is formed at a primary tail 2f shown in step (j)) by a second discharge produced by an electric torch 3. Afterward, the electric torch 3 is moved away in the direction indicated by the arrow.

In step (b), the capillary 1 is moved to a point above the first bonding point 4a on the pad 4; and in step (c), the capillary 1 is lowered. After this, the primary ball 2d at the tip end of the wire 2 is subjected to a first bonding to the first bonding point 4a.

Afterward, in step (d), the capillary 1 is raised, delivering the wire; and in step (e), the capillary 1 is moved to a point above the second bonding point 5a on the lead 5.

Next, in step (f), the capillary 1 is lowered, and the wire 2 is subjected to a second bonding to the second bonding point 5a.

Then, the capillary 1 is raised to a predetermined position, and a damper 6 is closed. Then the capillary 1 and clamper 6 are both raised together so that the wire 2 is tail-cut from the attachment root of the second bonding point 5a in step (g). As a result, a secondary tail 2b which extends from the tip end of the capillary 1 is formed.

Figures 3A, 3B, 3C:
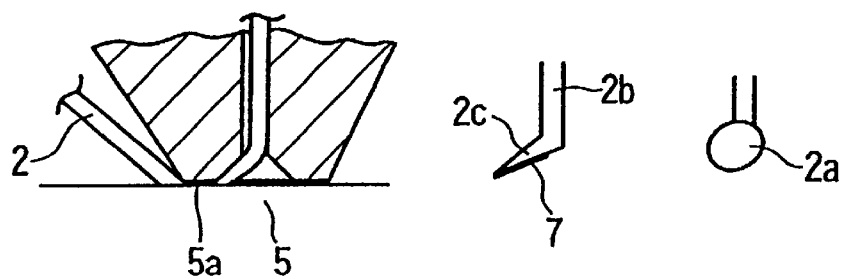
FIG. 3(a) shows the conditions of bonding to a second bonding point.
FIG. 3(b) is an explanatory diagram showing the shape of the tip end of the tail of a wire.
FIG. 3(c) is an explanatory diagram showing an eccentric ball formed at the end of the wire.

The tip end of the secondary tail 2b has a projection 2c (of the type illustrated in FIG. 3(b) as described above) as shown in the enlarged view (in step (g')) shown on the right side of the step (g). Impurities 7 on the surface of the lead 5 adhere to the undersurface of the projection 2c.

In step (h), the electric torch 3 is moved to a point beneath the secondary tail 2b, and a secondary ball 2e is formed by an electric discharge produced by the electric torch 3. This secondary ball 2e is eccentric and has adhering impurities 7 as described before.

Following the formation of the secondary ball 2e, the electric torch 3 is withdrawn.

Next, in step (i), the capillary 1 is lowered while it is moved to a point above the vicinity of the second bonding point 5a, and the secondary ball 2e is ball-bonded at a point near the second bonding point 5a.

Then, in step (j), the capillary 1 and clamper 6 are both raised together, and the damper 6 is closed at an intermediate point during this rising, thus performing a tail-cut in the wire 2. As a result, the primary tail 2f which extends from the tip end of the capillary 1 is formed. The reference numeral 9 is a ball bond formed by the bonded secondary ball 2e (see step (i)).

Then, the capillary 1 is moved to a point above the first bonding point 4a that is to be bonded next. Specifically, the state shown in step (a) is attained. Then, the electric torch 3 is moved to a point beneath the primary tail 2f, and a primary ball 2d is formed by the primary discharge.

Afterward, the above-described series of operations is repeated for each wire that is connected.

As seen from the above, since the secondary ball 2e which contains impurities 7 is ball-bonded 9 near the second bonding point, the primary ball 2d that is formed after the secondary ball 2e is bonded contains no impurities. Also, since the primary tail 2f is cut from the upper portion of the neck of the secondary ball 2e, the cutting position of the wire is consistent. In other words, the length of the primary tail 2f becomes consistent. Moreover, when the primary tail 2f is to be formed, the wire is cut while it is being stretched; accordingly, the tip end of the primary tail 2f always has a pointed shape as shown in the enlarged view (in step j')) which is on the right side of step (j) in FIG. 1. As a result, the discharge distance of the electric torch is consistent, and a high-quality primary ball 2d of a specified size can be formed consistently. Also, extremely small balls can be formed, and a fine pitch bonding pattern in which the pad spacing is as narrow as approximately 50 to 60 μm can be accomplished.

The experiments conducted by the inventors confirmed that when the diameter of the secondary ball 2e is 1.7 times the diameter of the wire 2 or greater, the diameter of the primary ball 2d can be 1.5 times the diameter of the wire 2 or less.

As seen from the above, according to the present invention, in a wire bonding method in which a first bonding is performed on a first bonding point, then the wire is delivered from the capillary and a second bonding is performed on a second bonding point to connect by the wire the first bonding point and second bonding point, a secondary ball is formed on a secondary tail of the wire extending from the tip end of the capillary by a secondary discharge by an electric torch, this secondary ball is ball-bonded in an arbitrary point near the second bonding point, a primary tail extending from the tip end of the capillary is next formed, a primary ball is formed at the end of the primary tail by performing a second discharge by the electric torch, and this primary ball is bonded to the next first bonding point. Accordingly, the primary ball that is subjected to a first bonding to first bonding points can be consistently formed as an extremely small ball.

What is claimed is:

1. A wire bonding method in which a first bonding is performed on a first bonding point, after which a wire is delivered from a capillary and a second bonding is performed on a second bonding point so that said first bonding point and second bonding point are connected by said wire, said bonding method, after said second bonding, further comprising the steps of:

separating said wire from said second bonding point so as to form a secondary tail in said wire extending from a tip end of said capillary, forming a secondary ball at an end of said secondary tail by performing a secondary discharge with an electric torch, ball-bonding said secondary ball at an arbitrary point other than said second bonding point, separating said wire from said ball-bonded secondary ball so as to form a primary tail that extends from said tip end of said capillary, forming a primary ball at an end of said primary tail by performing a primary discharge with said electric torch, and bonding said primary ball to a next first bonding point.

2. The wire bonding method according to claim 1, wherein said secondary ball is of a large value, while said primary ball is of a small value.

3. A wire bonding method in which a first bonding is performed on a first bonding point, after which a wire is delivered from a capillary and a second bonding is performed on a second bonding point so that said first bonding point and said second bonding point are connected by said wire, said method, after said second bonding, further comprising the steps of:

separating said wire from said second bonding point so as to form a secondary tail in said wire extending from a tip end of said capillary, forming a secondary ball at an end of said secondary tail by performing a secondary discharge with an electric touch, ball-bonding said second ball at an arbitrary point other than said second bonding point, separating said wire from said ball-bonded secondary ball so as to form a primary tail that extends from said tip end of said capillary, forming a primary ball at an end of said primary tail by performing a primary discharge with said electric touch, and bonding said primary ball to a next first bonding point, and wherein said secondary ball is of large value, while said primary ball is of a small value, and a diameter of said secondary ball is 1.7 times a diameter of said wire or greater, and a diameter of said primary ball is 1.5 times a diameter of said wire or less.

* * * * *